(12) United States Patent
Staller et al.

(10) Patent No.: US 12,087,632 B2
(45) Date of Patent: Sep. 10, 2024

(54) INTEGRATED CIRCUITRY, MEMORY ARRAYS COMPRISING STRINGS OF MEMORY CELLS, METHODS USED IN FORMING INTEGRATED CIRCUITRY, AND METHODS USED IN FORMING A MEMORY ARRAY COMPRISING STRINGS OF MEMORY CELLS

(71) Applicant: Micron Technology, Inc., Boise, ID (US)

(72) Inventors: Corey Staller, Boise, ID (US); Anilkumar Chandolu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 170 days.

(21) Appl. No.: 17/542,787

(22) Filed: Dec. 6, 2021

(65) Prior Publication Data
US 2022/0093467 A1 Mar. 24, 2022

Related U.S. Application Data

(62) Division of application No. 16/814,750, filed on Mar. 10, 2020, now Pat. No. 11,222,825.

(51) Int. Cl.
*H01L 21/02* (2006.01)
*H01L 21/8234* (2006.01)
(Continued)

(52) U.S. Cl.
CPC ........... *H01L 21/823412* (2013.01); *H01L 21/02112* (2013.01); *H01L 21/02225* (2013.01);
(Continued)

(58) Field of Classification Search
None
See application file for complete search history.

(56) References Cited

U.S. PATENT DOCUMENTS 5,801,092 A * 9/1998 Ayers ............... H01L 21/02282
427/510
9,875,929 B1 1/2018 Shukla et al.
(Continued)

OTHER PUBLICATIONS

Armelao et al., "Ion-, photoelectron- and laser-assisted analytical investigation of nano-structure mixed HfO2—SiO2 and ZrO2—SiO2 thin films", Applied Surface Science, 2005, Netherlands, pp. 277-294.

*Primary Examiner* — Sarah K Salerno
(74) *Attorney, Agent, or Firm* — Wells St. John P.S.

(57) ABSTRACT

A method used in forming integrated circuitry comprises forming a stack comprising vertically-alternating first tiers and second tiers. A stair-step structure is formed into the stack. A first liquid is applied onto the stair-step structure. The first liquid comprises insulative physical objects that individually have at least one of a maximum submicron dimension or a minimum submicron dimension. The first liquid is removed to leave the insulative physical objects touching one another and to have void-spaces among the touching insulative physical objects. A second liquid that is different from the first liquid is applied into the void-spaces. The second liquid is changed into a solid insulative material in the void-spaces. Other embodiments, including structure, are disclosed.

18 Claims, 16 Drawing Sheets

(51) Int. Cl.
*H10B 41/27* (2023.01)
*H10B 43/27* (2023.01)

(52) U.S. Cl.
CPC .. *H01L 21/02282* (2013.01); *H01L 21/02321* (2013.01); *H01L 21/02343* (2013.01); *H01L 21/823437* (2013.01); *H10B 41/27* (2023.02); *H10B 43/27* (2023.02)

(56) References Cited

U.S. PATENT DOCUMENTS

| | | | |
|---|---|---|---|
| 2007/0284649 | A1 | 12/2007 | Iwasawa |
| 2009/0242867 | A1 | 10/2009 | Rho |
| 2013/0269992 | A1 | 10/2013 | Doi et al. |
| 2014/0147578 | A1* | 5/2014 | Sekine ............... H01B 3/18 |
| | | | 106/287.13 |
| 2016/0005759 | A1* | 1/2016 | Kim ............... H10B 41/50 |
| | | | 257/314 |
| 2017/0077026 | A1 | 3/2017 | Okawa et al. |
| 2020/0051995 | A1 | 2/2020 | Tanaka et al. |

* cited by examiner

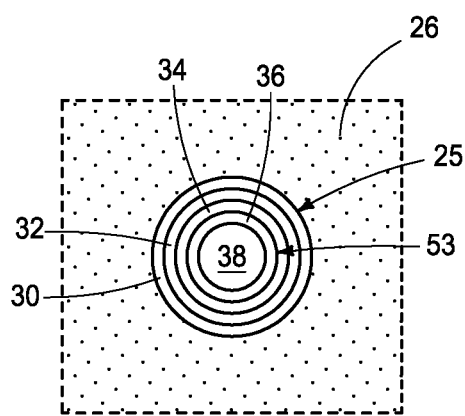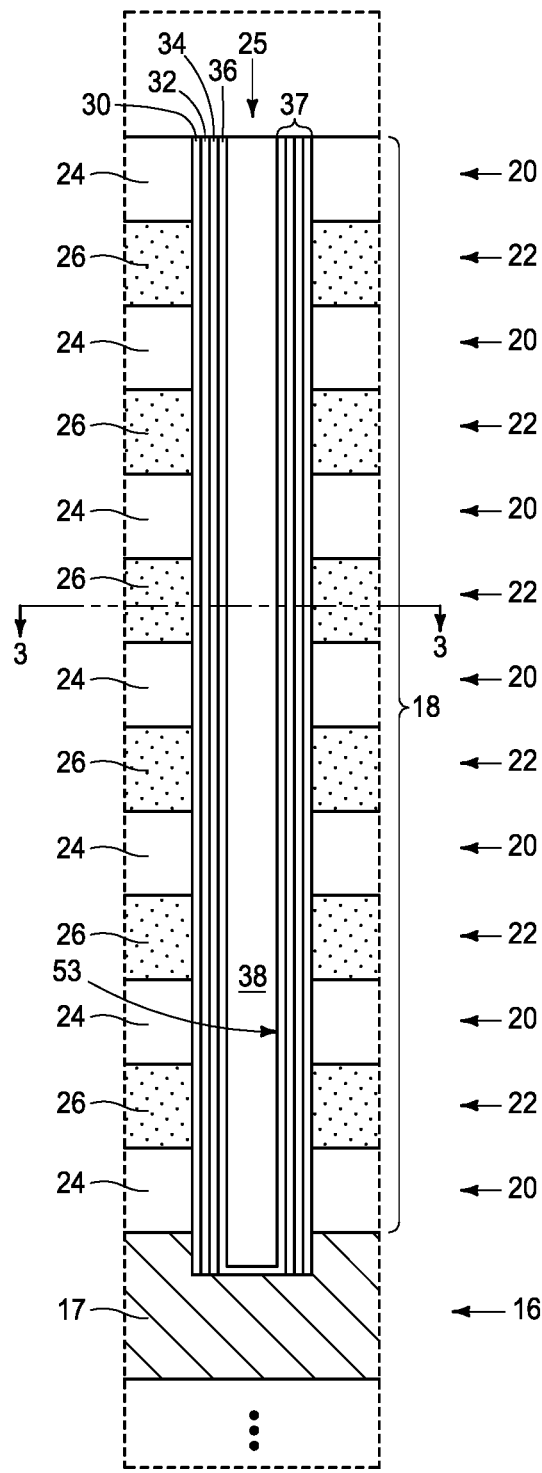
FIG. 3
FIG. 4

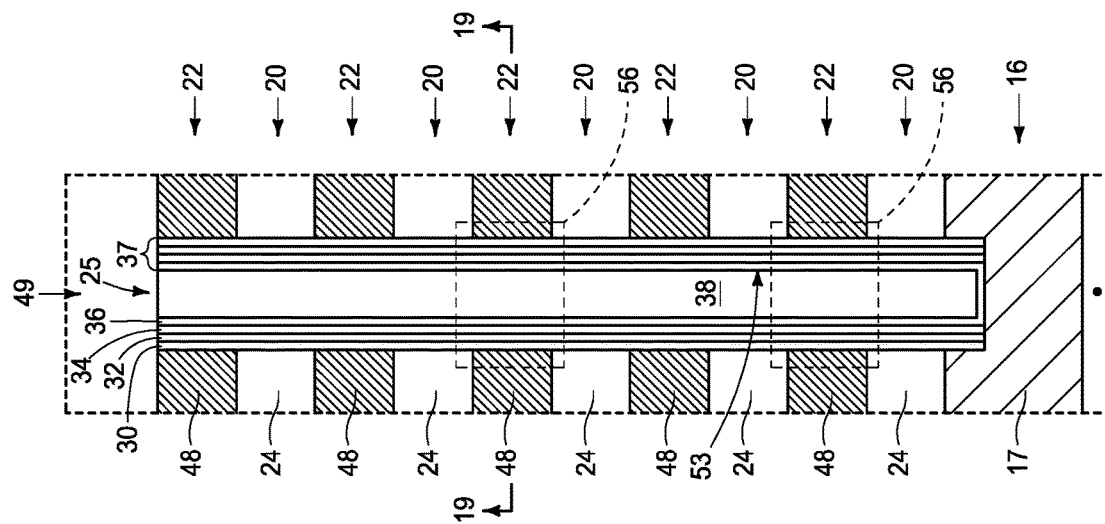
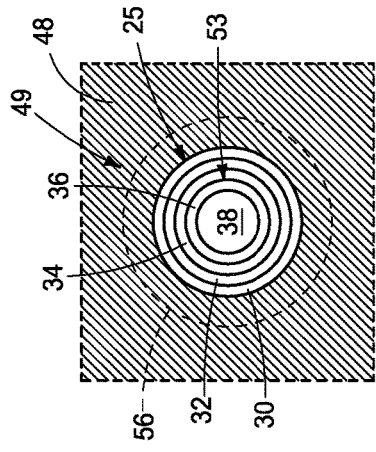
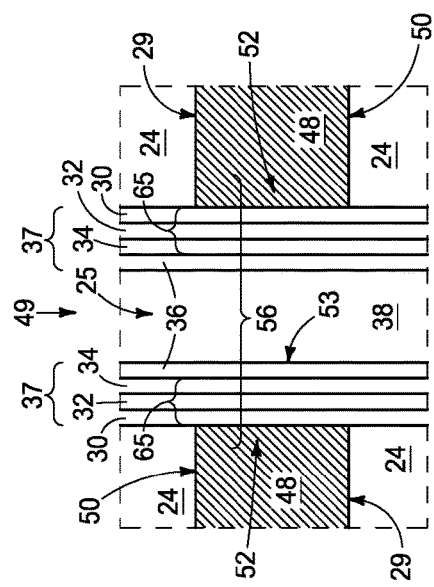

INTEGRATED CIRCUITRY, MEMORY ARRAYS COMPRISING STRINGS OF MEMORY CELLS, METHODS USED IN FORMING INTEGRATED CIRCUITRY, AND METHODS USED IN FORMING A MEMORY ARRAY COMPRISING STRINGS OF MEMORY CELLS

RELATED PATENT DATA

This patent resulted from a divisional application of U.S. patent application Ser. No. 16/814,750, filed Mar. 10, 2020, entitled "Integrated Circuitry, Memory Arrays Comprising Strings Of Memory Cells, Methods Used In Forming Integrated Circuitry, And Methods Used In Forming A Memory Array Comprising Strings Of Memory Cells", naming Corey Staller and Anilkumar Chandolu as inventors, the disclosure of which is incorporated by reference.

TECHNICAL FIELD

Embodiments disclosed herein pertain to integrated circuitry, to memory arrays comprising strings of memory cells, to methods used in forming integrated circuitry, and to methods used in forming a memory array comprising strings of memory cells.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense lines) and access lines (which may also be referred to as wordlines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate.

Flash memory is one type of memory and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of integrated flash memory. A NAND cell unit comprises at least one selecting device coupled in series to a serial combination of memory cells (with the serial combination commonly being referred to as a NAND string). NAND architecture may be configured in a three-dimensional arrangement comprising vertically-stacked memory cells individually comprising a reversibly programmable vertical transistor. Control or other circuitry may be formed below the vertically-stacked memory cells. Other volatile or non-volatile memory array architectures may also comprise vertically-stacked memory cells that individually comprise a transistor.

Memory arrays may be arranged in memory pages, memory blocks and partial blocks (e.g., sub-blocks), and memory planes, for example as shown and described in any of U.S. Patent Application Publication Nos. 2015/0228651, 2016/0267984, and 2017/0140833. The memory blocks may at least in part define longitudinal outlines of individual wordlines in individual wordline tiers of vertically-stacked memory cells. Connections to these wordlines may occur in a so-called "stair-step structure" at an end or edge of an array of the vertically-stacked memory cells. The stair-step structure includes individual "stairs" (alternately termed "steps" or "stair-steps") that define contact regions of the individual wordlines upon which elevationally-extending conductive vias contact to provide electrical access to the wordlines.

BRIEF DESCRIPTION OF THE DRAWINGS

FIGS. 3-4 are enlarged views of portions of FIG. 2.

FIGS. 6-21 are diagrammatic sequential sectional, expanded, enlarged, and/or partial views of the construction of FIGS. 1-5, or portions thereof, in process in accordance with some embodiments of the invention.

DETAILED DESCRIPTION OF EXAMPLE EMBODIMENTS

Figure 1:
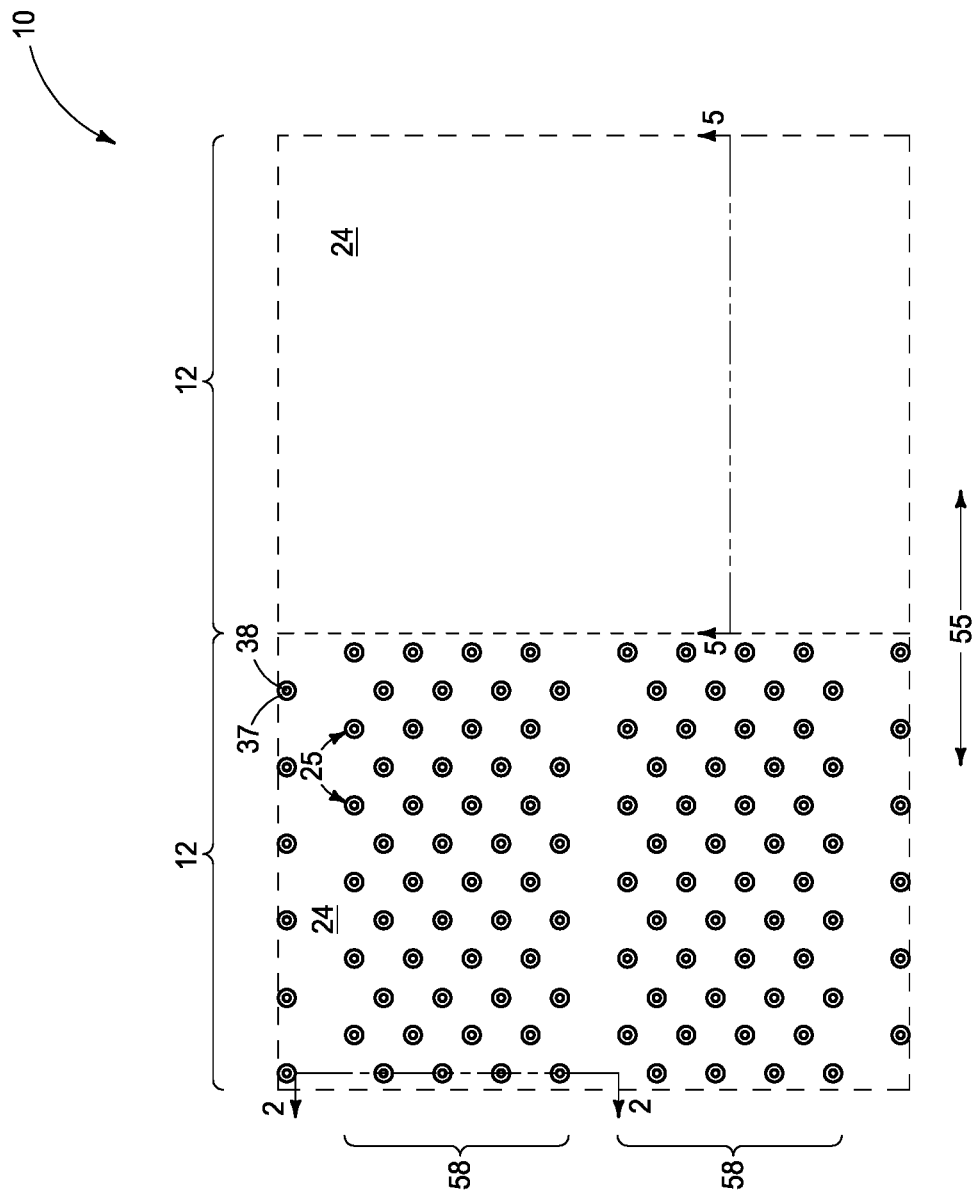
FIG. 1 is a diagrammatic cross-sectional view of a portion of a substrate in process in accordance with an embodiment of the invention and is taken through line 1-1 in FIG. 2.
Figure 2:
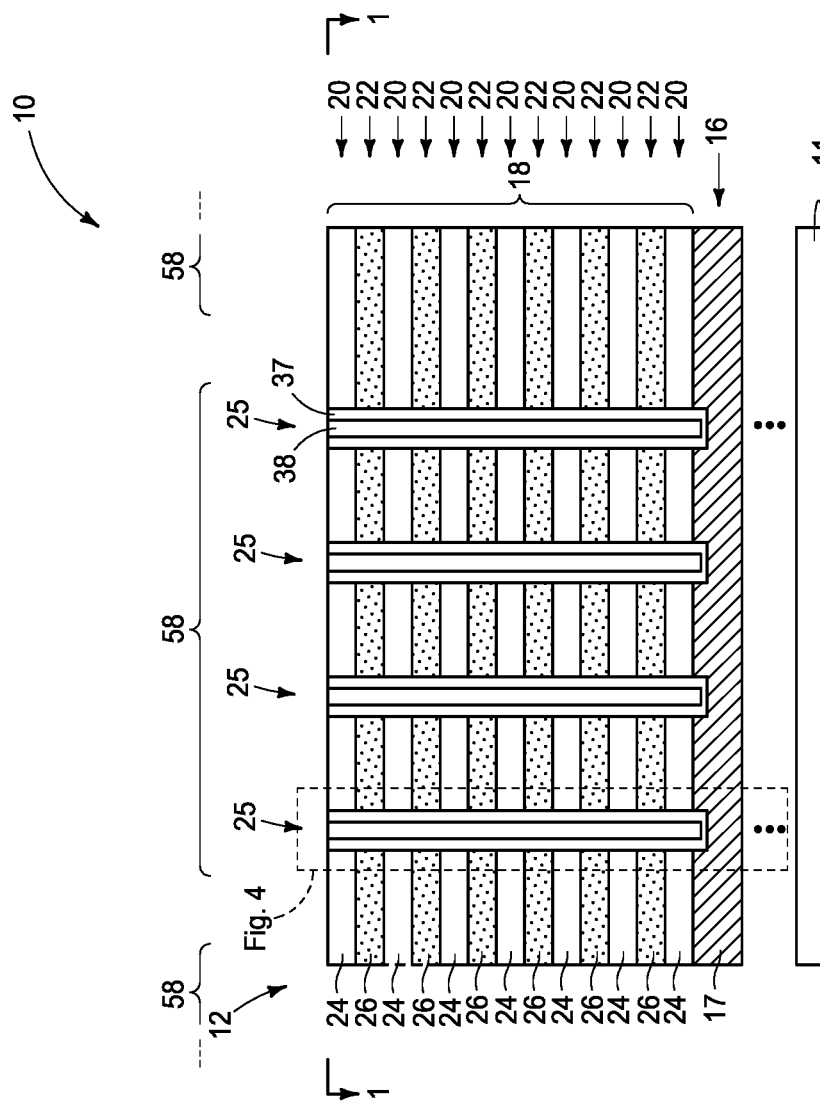
FIG. 2 is a diagrammatic cross-sectional view taken through line 2-2 in FIG. 1.
Figure 5:
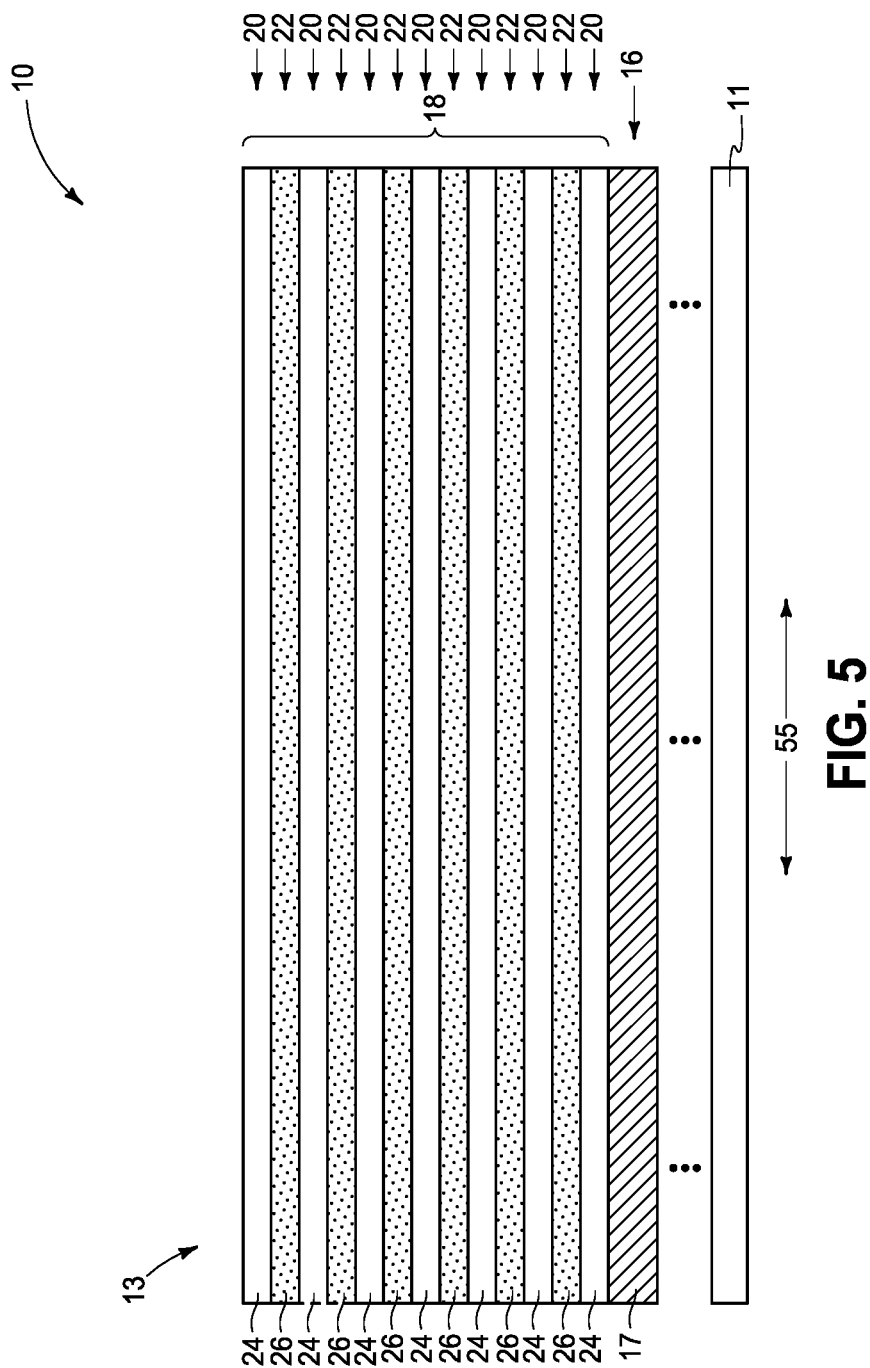
FIG. 5 is a diagrammatic cross-sectional view taken through line 5-5 in FIG. 1.

Embodiments of the invention encompass methods used in forming integrated circuitry, for example memory circuitry, logic circuitry, or other existing or future-developed integrated circuitry. In one example, such integrated circuitry comprises a memory array such as an array of NAND or other memory cells that may have at least some peripheral control circuitry under the array (e.g., CMOS-under-array). Embodiments of the invention also encompass existing or future-developed integrated circuitry independent of method of manufacture, for example memory circuitry comprising a memory array (e.g., NAND architecture). First example method embodiments are described with reference to FIGS. 1-21 which may be considered as a "gate-last" or "replacement-gate" process in the forming of memory circuitry, and starting with FIGS. 1-5.

FIGS. 1-5 show a construction 10 having a memory-array region 12 in which elevationally-extending strings of transistors and/or memory cells will be formed. Construction 10 also includes a stair-step region 13 in which one or more stair-step structures will be formed. Example construction 10 comprises a base substrate 11 having any one or more of conductive/conductor/conducting, semiconductive/semiconductor/semiconducting, or insulative/insulator/insulating (i.e., electrically herein) materials. Various materials have been formed elevationally over base substrate 11. Materials may be aside, elevationally inward, or elevationally outward of the FIGS. 1-5-depicted materials. For example, other partially or wholly fabricated components of integrated circuitry may be provided somewhere above, about, or within base substrate 11. Control and/or other peripheral circuitry for operating components within an array (e.g., array 12) of elevationally-extending strings of memory cells may also be fabricated and may or may not be wholly or partially within an array or sub-array. Further, multiple sub-arrays may also be fabricated and operated independently, in tandem, or otherwise relative one another. In this document, a "sub-array" may also be considered as an array.

A conductor tier 16 comprising conductor material 17 has been formed above substrate 11. Conductor tier 16 may comprise part of control circuitry (e.g., peripheral-under-array circuitry and/or a common source line or plate) used to control read and write access to the transistors and/or memory cells that will be formed within array 12. A stack 18 comprising vertically-alternating insulative tiers 20 and conductive tiers 22 has been formed above conductor tier 16. Example thickness for each of tiers 20 and 22 is 22 to 60 nanometers. Only a small number of tiers 20 and 22 is shown, with more likely stack 18 comprising dozens, a hundred or more, etc. of tiers 20 and 22. Other circuitry that may or may not be part of peripheral and/or control circuitry may be between conductor tier 16 and stack 18. For example, multiple vertically-alternating tiers of conductive material and insulative material of such circuitry may be below a lowest of the conductive tiers 22 and/or above an uppermost of the conductive tiers 22. For example, one or more select gate tiers (not shown) may be between conductor tier 16 and the lowest conductive tier 22 and one or more select gate tiers may be above an uppermost of conductive tiers 22. Alternately or additionally, at least one of the depicted uppermost and lowest conductive tiers 22 may be a select gate tier. Regardless, conductive tiers 22 (alternately referred to as first tiers) may not comprise conducting material and insulative tiers 20 (alternately referred to as second tiers) may not comprise insulative material or be insulative at this point in processing in conjunction with the hereby initially-described example method embodiment which is "gate-last" or "replacement-gate". Example conductive tiers 22 comprise first material 26 (e.g., silicon nitride) which may be wholly or partially sacrificial. Example insulative tiers 20 comprise second material 24 (e.g., silicon dioxide) that is of different composition from that of first material 26 and which may be wholly partially sacrificial.

Channel openings 25 have been formed (e.g., by etching) through insulative tiers 20 and conductive tiers 22 to conductor tier 16. Channel openings 25 may taper radially-inward (not shown) moving deeper in stack 18. In some embodiments, channel openings 25 may go into conductor material 17 of conductor tier 16 as shown or may stop there-atop (not shown). Alternately, as an example, channel openings 25 may stop atop or within the lowest insulative tier 20. A reason for extending channel openings 25 at least to conductor material 17 of conductor tier 16 is to assure direct electrical coupling of subsequently-formed channel material (not yet shown) to conductor tier 16 without using alternative processing and structure to do so when such a connection is desired. Etch-stop material (not shown) may be within or atop conductor material 17 of conductor tier 16 to facilitate stopping of the etching of channel openings 25 relative to conductor tier 16 when such is desired. Such etch-stop material may be sacrificial or non-sacrificial. By way of example and for brevity only, channel openings 25 are shown as being arranged in groups or columns of staggered rows of four openings 25 per row and being arrayed in laterally-spaced memory-block regions 58 that will comprise laterally-spaced memory blocks 58 in a finished circuitry construction. In this document, "block" is generic to include "sub-block". Memory-block regions 58 and resultant memory blocks 58 (not yet shown) may be considered as being longitudinally elongated and oriented, for example along a direction 55, Memory-block regions 58 may otherwise not be discernable at this point of processing. Any alternate existing or future-developed arrangement and construction may be used.

Transistor channel material may be formed in the individual channel openings elevationally along the insulative tiers and the conductive tiers, thus comprising individual channel-material strings, which is directly electrically coupled with conductive material in the conductor tier. Individual memory cells of the example memory array being formed may comprise a gate region (e.g., a control-gate region) and a memory structure laterally between the gate region and the channel material. In one such embodiment, the memory structure is formed to comprise a charge-blocking region, storage material (e.g., charge-storage material), and an insulative charge-passage material. The storage material (e.g., floating gate material such as doped or undoped silicon or charge-trapping material such as silicon nitride, metal dots, etc.) of the individual memory cells is elevationally along individual of the charge-blocking regions. The insulative charge-passage material (e.g., a band gap-engineered structure having nitrogen-containing material [e.g., silicon nitride] sandwiched between two insulator oxides [e.g., silicon dioxide]) is laterally between the channel material and the storage material.

FIGS. 1-5 show one embodiment wherein charge-blocking material 30, storage material 32, and charge-passage material 34 have been formed in individual channel openings 25 elevationally along insulative tiers 20 and conductive tiers 22. Transistor materials 30, 32, and 34 (e.g., memory-cell materials) may be formed by, for example, deposition of respective thin layers thereof over stack 18 and within individual openings 25 followed by planarizing such back at least to a top surface of stack 18.

Channel material 36 has also been formed in channel openings 25 elevationally along insulative tiers 20 and conductive tiers 22, thus comprising individual operative channel-material strings 53 in channel openings 25. Channel-material strings 53 in one embodiment have memory-cell materials (e.g., 30, 32, and 34) there-along and with second-tier material (e.g., 24) being horizontally-between immediately-adjacent channel-material strings 53. Materials 30, 32, 34, and 36 are collectively shown as and only designated as material 37 in FIGS. 1 and 2 due to scale. Example channel materials 36 include appropriately-doped crystalline semiconductor material, such as one or more silicon, germanium, and so-called MTV semiconductor materials (e.g., GaAs, InP, GaP, and GaN). Example thickness for each of materials 30, 32, 34, and 36 is 25 to 100 Angstroms. Punch etching may be conducted to remove materials 30, 32, and 34 from the bases of channel openings 25 (not shown) to expose conductor tier 16 such that channel material 36 is directly against conductor material 17 of conductor tier 16. Such punch etching may occur separately with respect to each of materials 30, 32, and 34 (as shown) or may occur with respect to only some (not shown). Alternately, and by way of example only, no punch etching may be conducted and channel material 36 may be directly electrically coupled to conductor material 17 of conductor tier 16 only by a separate conductive interconnect (not yet shown). Channel openings 25 are shown as comprising a radially-central solid dielectric material 38 (e.g., spin-on-dielectric, silicon dioxide, and/or silicon nitride). Alternately, and by way of example only, the radially-central portion within channel openings 25 may include void space(s) (not shown) and/or be devoid of solid material (not shown).

The above processing is but one example of forming channel-material strings 53 in memory-array region 12. Alternate existing or future-developed techniques may be used and example channel-material strings 53 may be fabricated later in processing than as shown.

Figure 6:
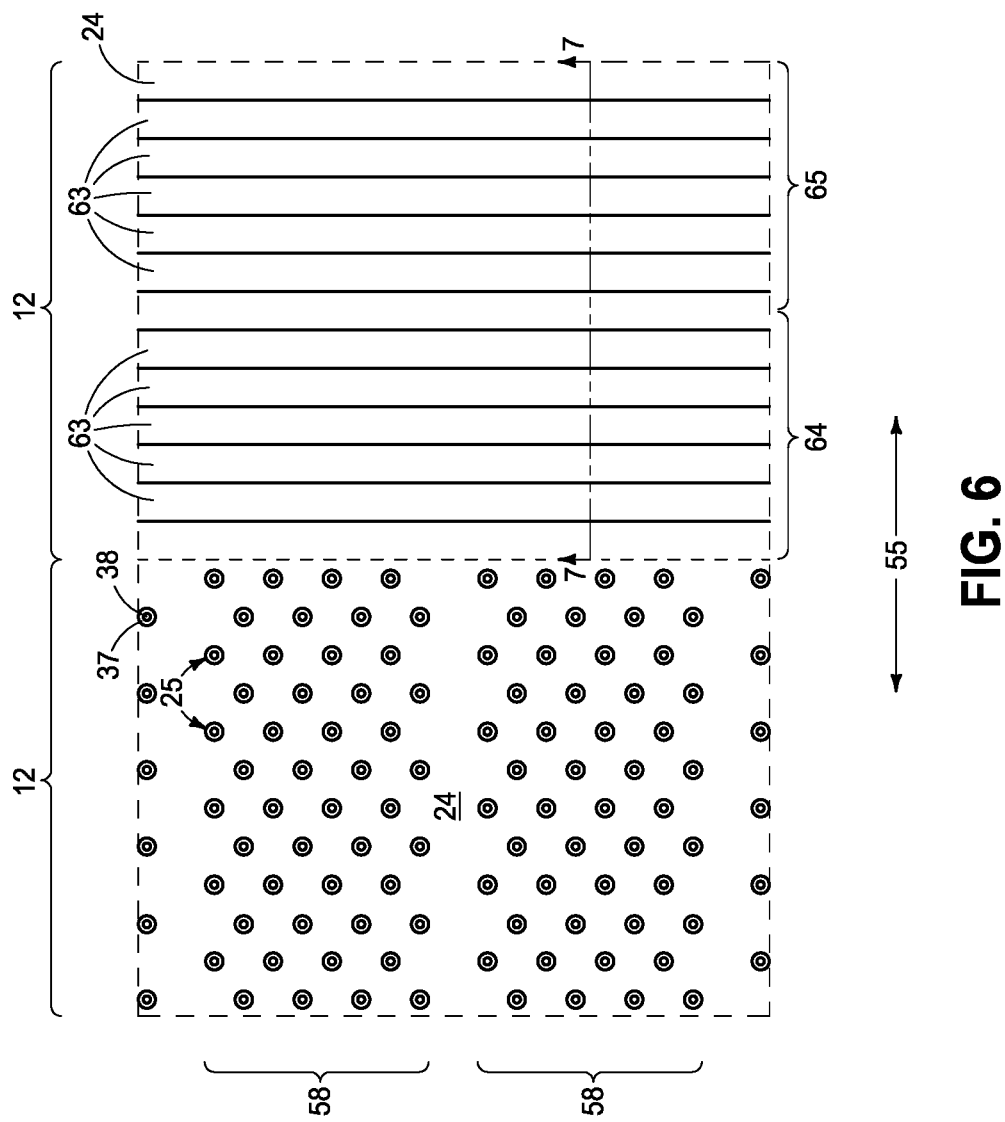
Figure 7:
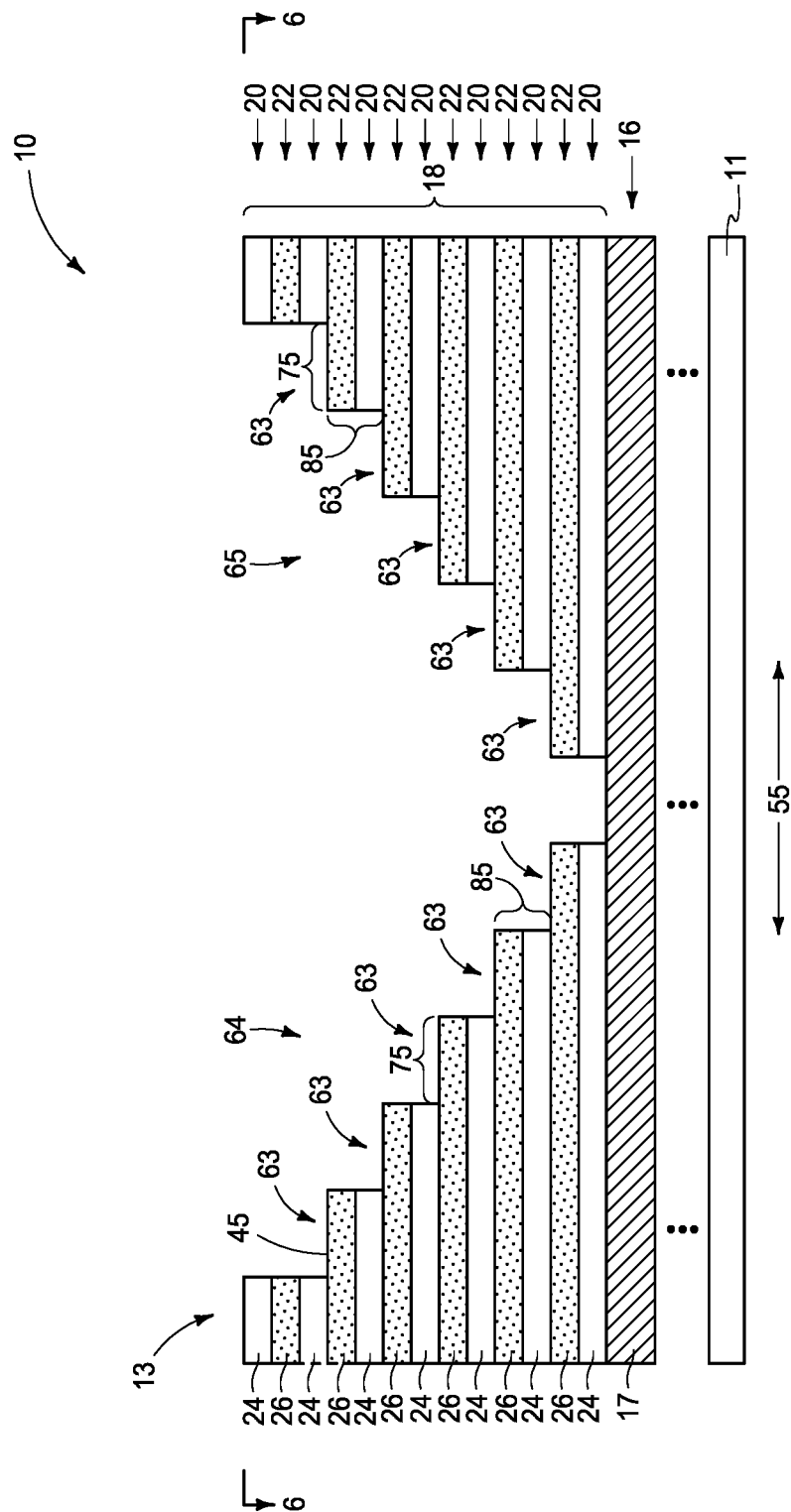

Referring to FIGS. 6 and 7, a stair-step structure 64 (e.g., having steps 63 that individually comprise a tread 75 and a riser 85) has been formed into stack 18 in stair-step region 13. Example stair-step structure 64 in the example "gate-last" method is circuit-inoperative but will comprise an operative stair-step structure in a finished-circuitry construction. An "operative stair-step structure" is circuit-operative having at least some conductive step thereof that electrically couples with and between a) an electronic component in memory array region 12, such as a transistor and/or memory cell, and b) an electronic component outside of memory-array region 12. Stair-step structure 64 may be formed by any existing or later-developed method(s). As one such example, a masking material (e.g., a photo-imageable material such as photoresist) may be formed atop stack 18 and an opening formed there-through. Then, the masking material may be used as a mask while etching (e.g., anisotropically) through the opening to extend such opening into at least two outermost two tiers 20, 22. The resultant construction may then be subjected to a successive alternating series of lateral-trimming etches of the masking material followed by etching deeper into stack 18, two-tiers 20, 22 at a time, using the trimmed masking material having a successively widened opening as a mask. Such an example may result in the forming of stair-step structure 64 into stack 18 that comprises vertically alternating tiers 20, 22 of different composition materials 24, 26, and in the forming of another stair-step structure 65 opposite and facing stair-step structure 64 (e.g., in mirror image and as shown). Such opposite stair-step structure 65 may be a dummy stair-step structure, A "dummy stair-step structure" is circuit-inoperative having steps thereof in which no current flows in conductive material of the steps and which may be a circuit-inoperable dead end that is not part of a current flow path of a circuit even if extending to or from an electronic component. Multiple operative stair-step structures (not shown) and multiple dummy stair-step structures (not shown) may be formed, for example longitudinally end-to-end in different portions of stair-step region 13 and to different depths within stack 18 (not shown). Pairs of opposing mirror-image operative and dummy stair-step structures may be considered as defining a stadium (e.g., a vertically recessed portion having opposing flights of stairs as shown).

Figure 8:
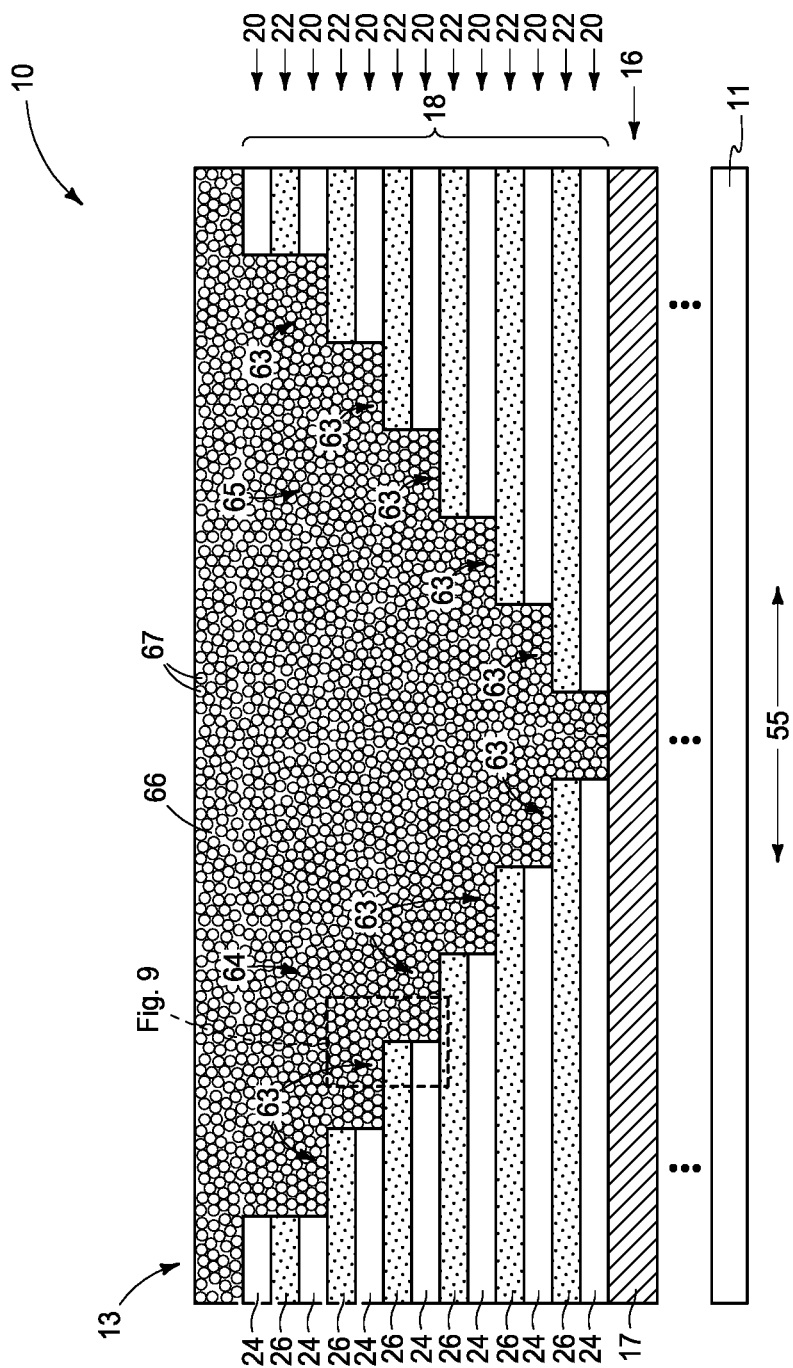
Figure 9:
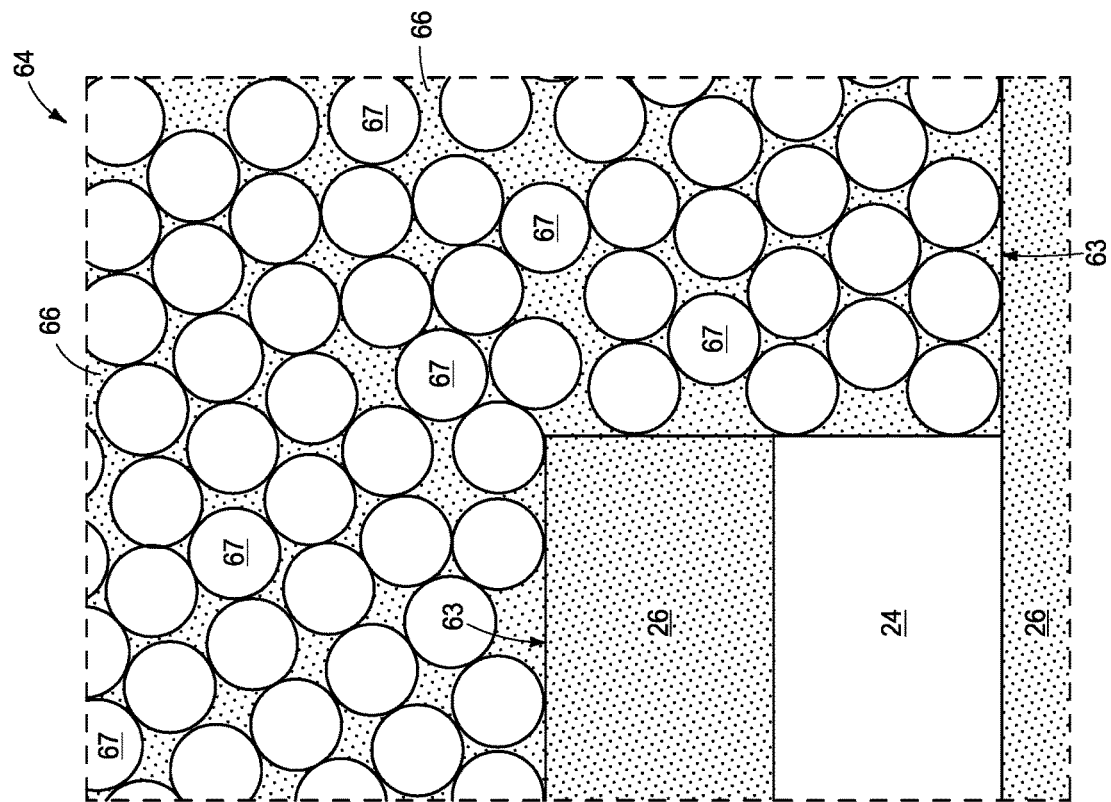

Referring to FIGS. 8 and 9, a first liquid 66 has been applied onto stair-step structure 64 (and stair-step 65 when present). First liquid 66 comprises insulative physical objects 67 therein that individually have at least one of a maximum submicron dimension or a minimum submicron dimension (such dimensions being a respective maximum and minimum straight-line length from a respective edge-to-an edge). Material of objects 67 may comprise any suitable insulative material, with some examples being one or more of silicon dioxide, silicon nitride, aluminum oxide, titanium oxide, hafnium oxide, and zirconium oxide. Example insulative physical objects 67 are shown as touching (contacting) one another although such may not occur significantly or at all at this point of processing. Further and regardless, example insulative physical objects 67 are shown diagrammatically as comprising perfect spheres of all the same size and shape (and not necessarily to scale relative to other components) for ease of depiction. Such of course need not be so. First liquid 66 with insulative physical objects 67 therein may be applied onto stair-step structure 64 by any existing or future-developed manner, with spin coating and spray coating being examples. Any existing or future-developed first liquid 66 may be used, for example those that are solvent-evaporative-upon-heating such as water, butyl ether, octane, etc.

In one embodiment, the at least one of the maximum submicron dimension or the minimum submicron dimension is no greater than 200 nanometers and no less than 1 nanometer. In one embodiment, the insulative physical objects only have one of the maximum submicron dimension or the minimum submicron dimension and in another embodiment have both of the maximum submicron dimension and the minimum submicron dimension. In one embodiment, the insulative physical objects comprise nanoparticles (i.e., a physical object having all of its straight-line dimensions therethrough from 1 to 100 nanometers). In one embodiment, the insulative physical objects comprise nanowires having two straight-line dimensions therethrough from 1 to 100 nanometers and an aspect ratio of 100 to 1,000). In one embodiment, the insulative physical objects comprise nanorods (nanocrylinders; two straight-line dimensions therethrough from 1 to 100 nanometers and an aspect ratio from 2 to 99). In one embodiment, the insulative physical objects comprise quantum dots. In one embodiment, the insulative physical objects comprise a combination of at least two of nanoparticles, nanowires, nanorods, and quantum dots.

Figure 10:
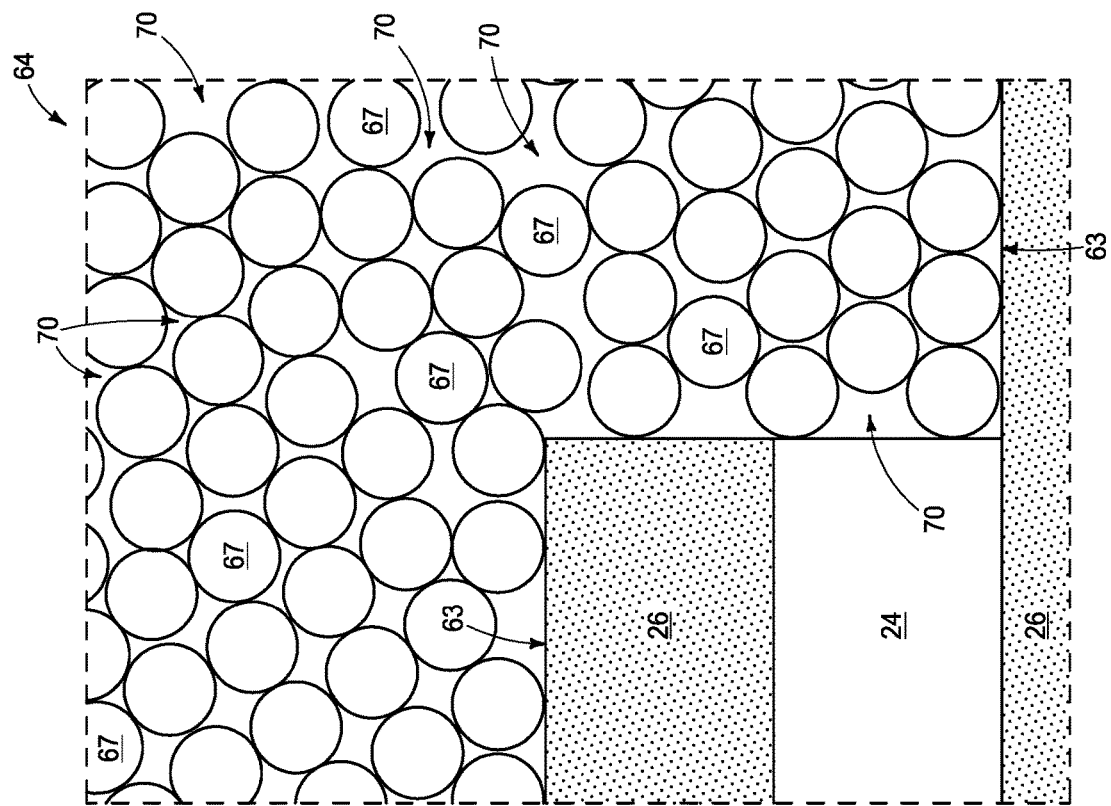

Referring to FIG. 10, such shows processing subsequent to that shown by FIG. 9. First liquid 66 (not shown) has been removed to leave insulative physical objects 67 touching one another and to have void-spaces 70 among touching insulative physical objects 67. Not all immediately-adjacent insulative physical objects 67 need touch one another. Ideally, all of the first liquid is removed as shown, but not necessarily so. An example manner of removing the first liquid is by heating, for example to evaporate the first liquid away. Example such processing includes exposure to 100° C. to 800° C. for from 10 minutes to 8 hours.

Figure 11:
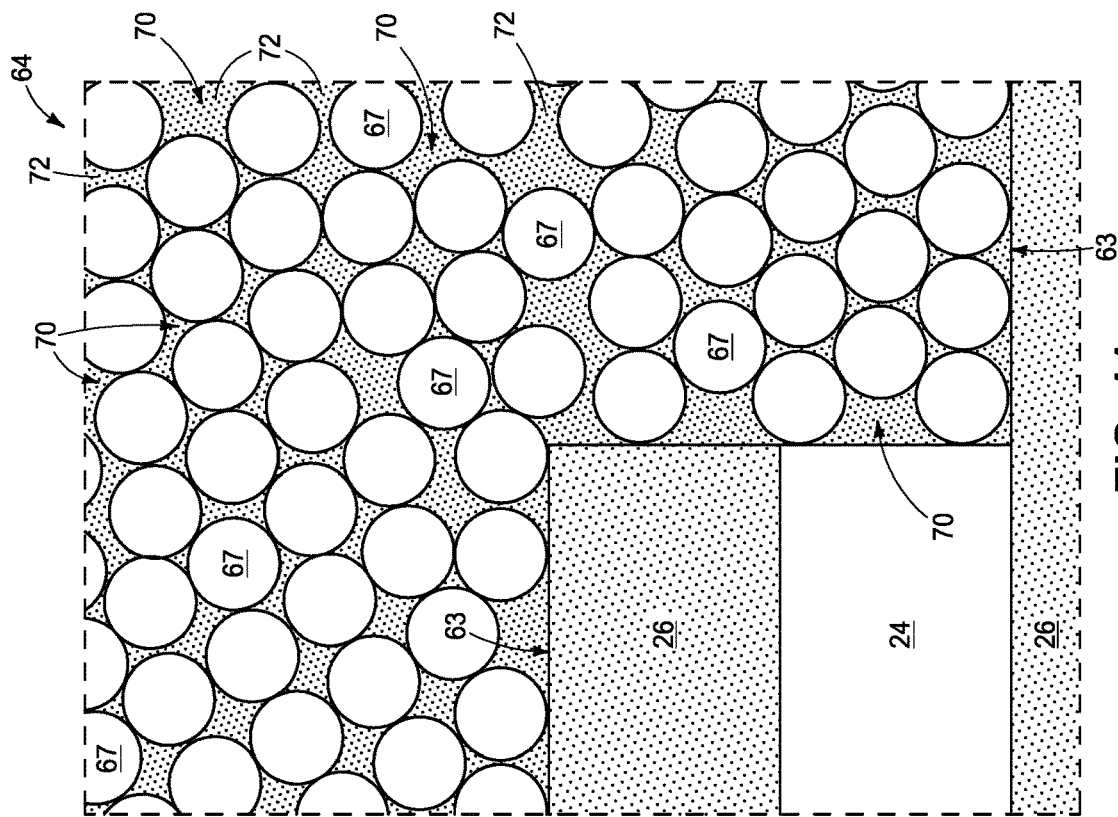

Referring to FIG. 11, such shows processing subsequent to that shown by FIG. 10. Second liquid 72, that is different from the first liquid 66, has been applied into void-spaces 70.

Ideally, such fills remaining volume of void-spaces 70 touching as shown. Second liquid 72 is capable of being changed to a solid insulative material, with spin-on-dielectric being one example, although any other existing or future-developed liquid so capable may be used. Second liquid 72 may be applied into void spaces 70 by any existing or future-developed manner, with spin coating and spray coating being examples.

Figure 12:
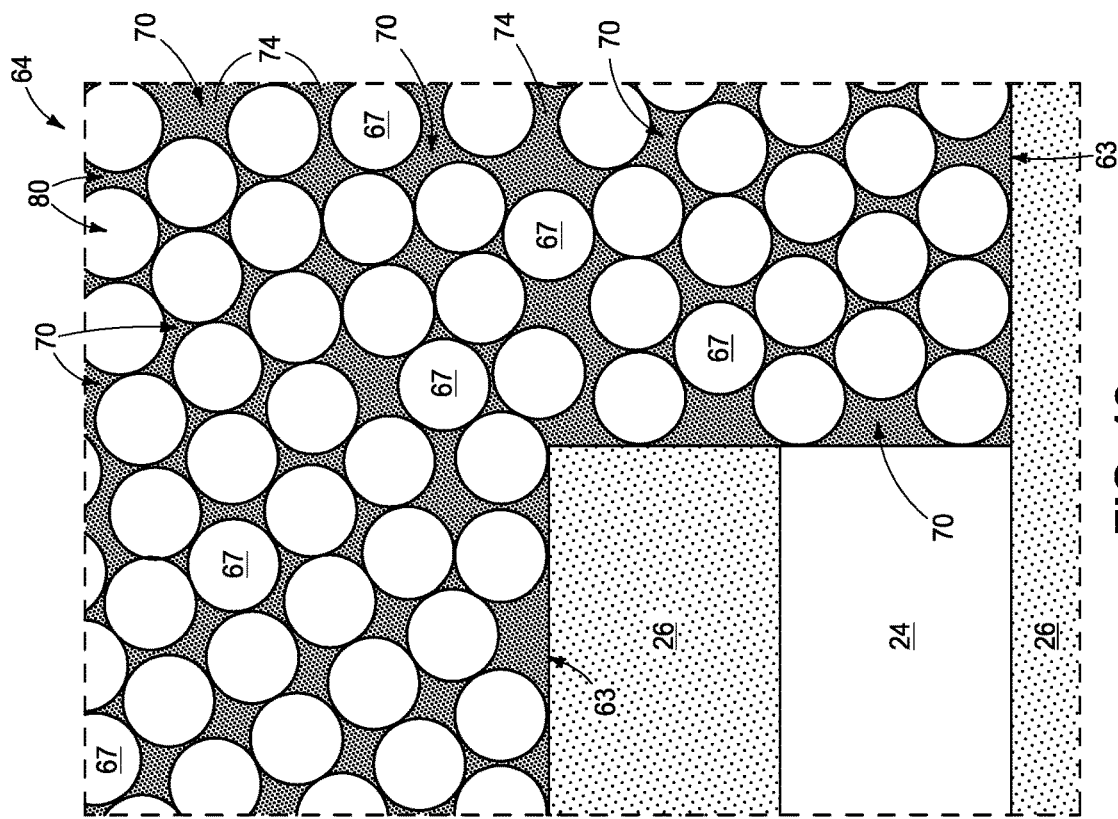

Referring to FIG. 12, such shows processing subsequent to that shown by FIG. 11. Second liquid 72 has been changed into a solid insulative material 74 in void-spaces 70. In one embodiment, insulative physical objects 67 and solid insulative material 74 may in combination be considered as insulting material 80 that is atop individual treads 75 and aside individual risers 85. An example spin-on dielectric second liquid 72 (FIG. 11) is composed of perhydropolysilazane, for example that can be deposited at room temperature followed by baking at 150° C. If baked in an ambient of $N_2$, oxynitride will be formed as solid insulative material 74. If not, silicon dioxide may be formed. Regardless, after baking, it can be densified in steam at 500° C. to 1,000° C. By way of examples only, others include sol-gel spin-on solutions (e.g., that result in $HfO_2$—$SiO_2$/$ZrO_2$—$SiO_2$ using copolymerization of organically modified crystalline oxozirconium $(Zr_4O_2(octyl\text{-}methoxycinnamate)_{12})$ or oxohafnium cluster ($Hf_4O_2$(octyl-methoxycinnamate with pre-hydrolyzed (methacryloxymethyl)triethoxysilane). Insulative physical objects 67 and solid insulative material 74 may comprise the same composition or different compositions relative one another. Even if of the same composition and phase, insulative physical objects 67 and solid insulative material 74 may be discernible relative one another due to perceptible interfaces there-between. In one embodiment, insulative physical objects 67 are crystalline (i.e., individually being at least 90% by volume crystalline) and solid insulative material 74 is amorphous (i.e., being at least 90% by volume amorphous).

Figure 13:
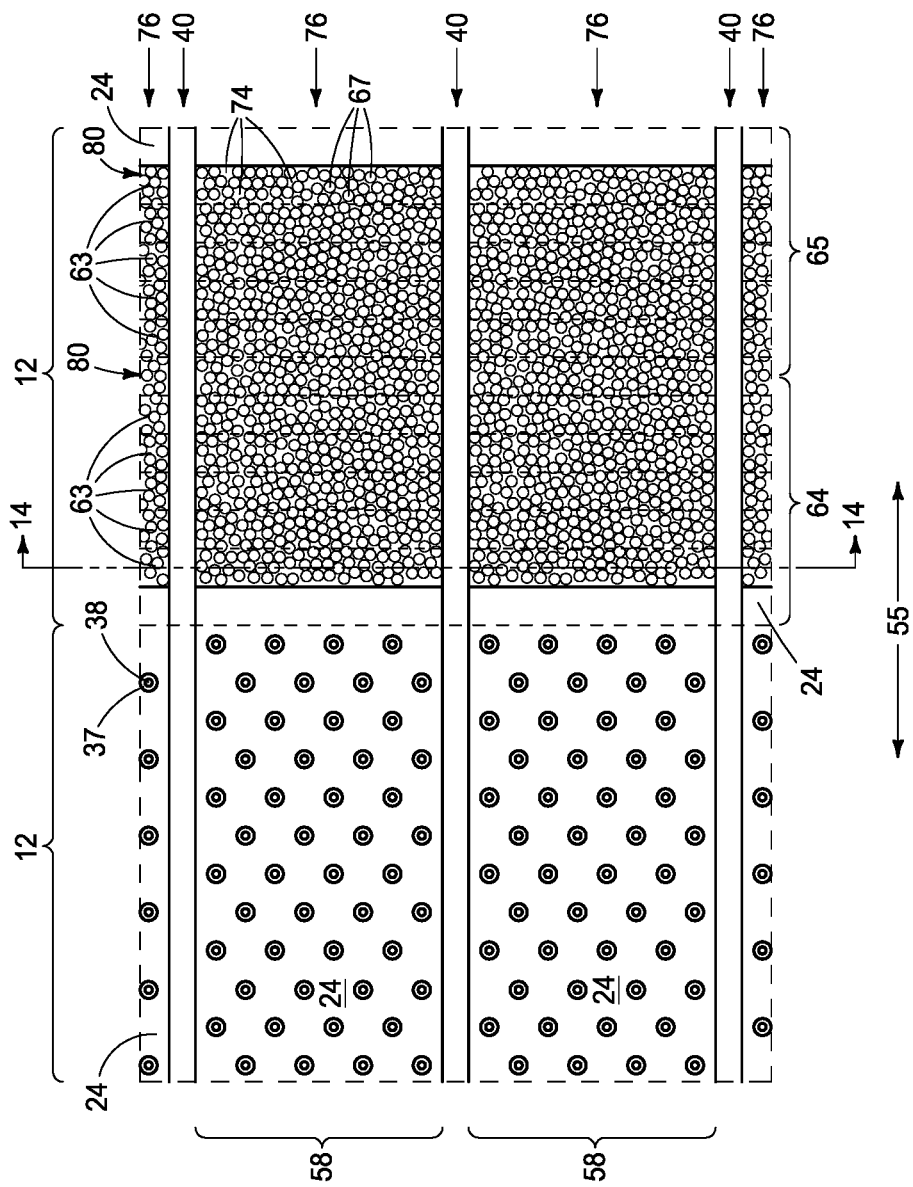
Figure 14:
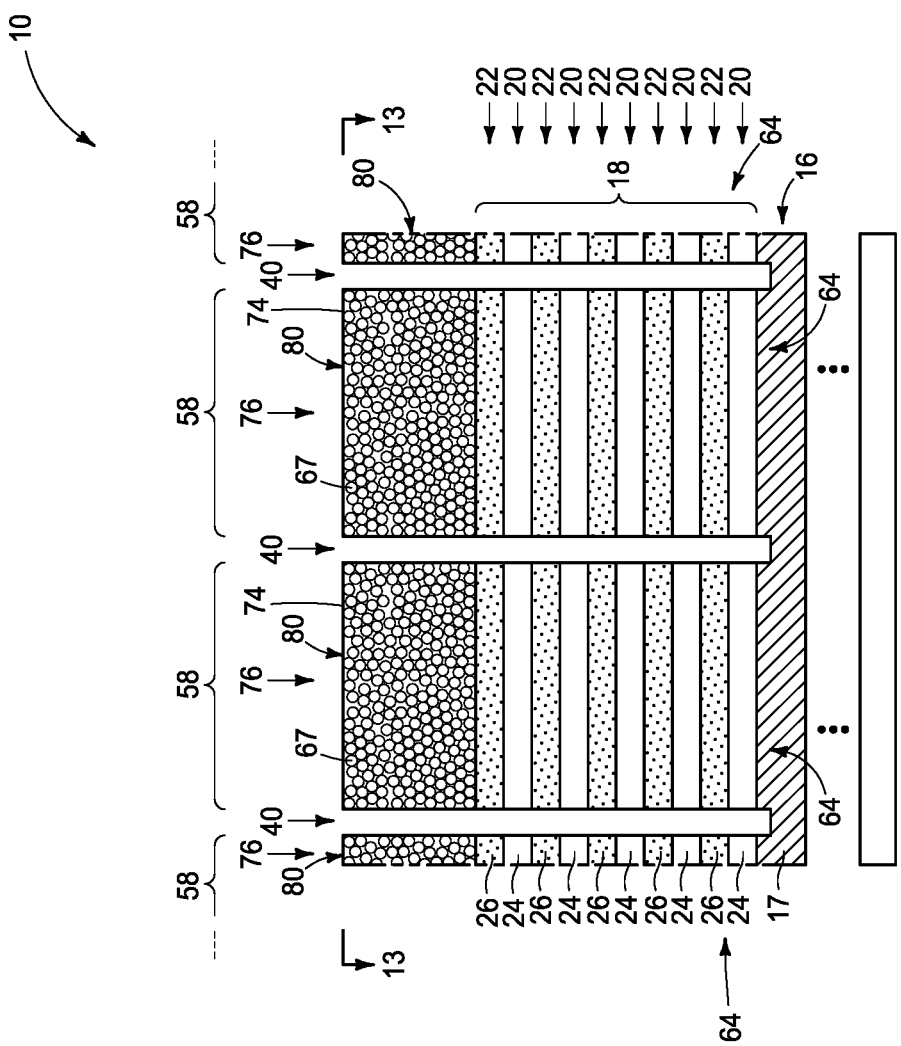
Figure 15:
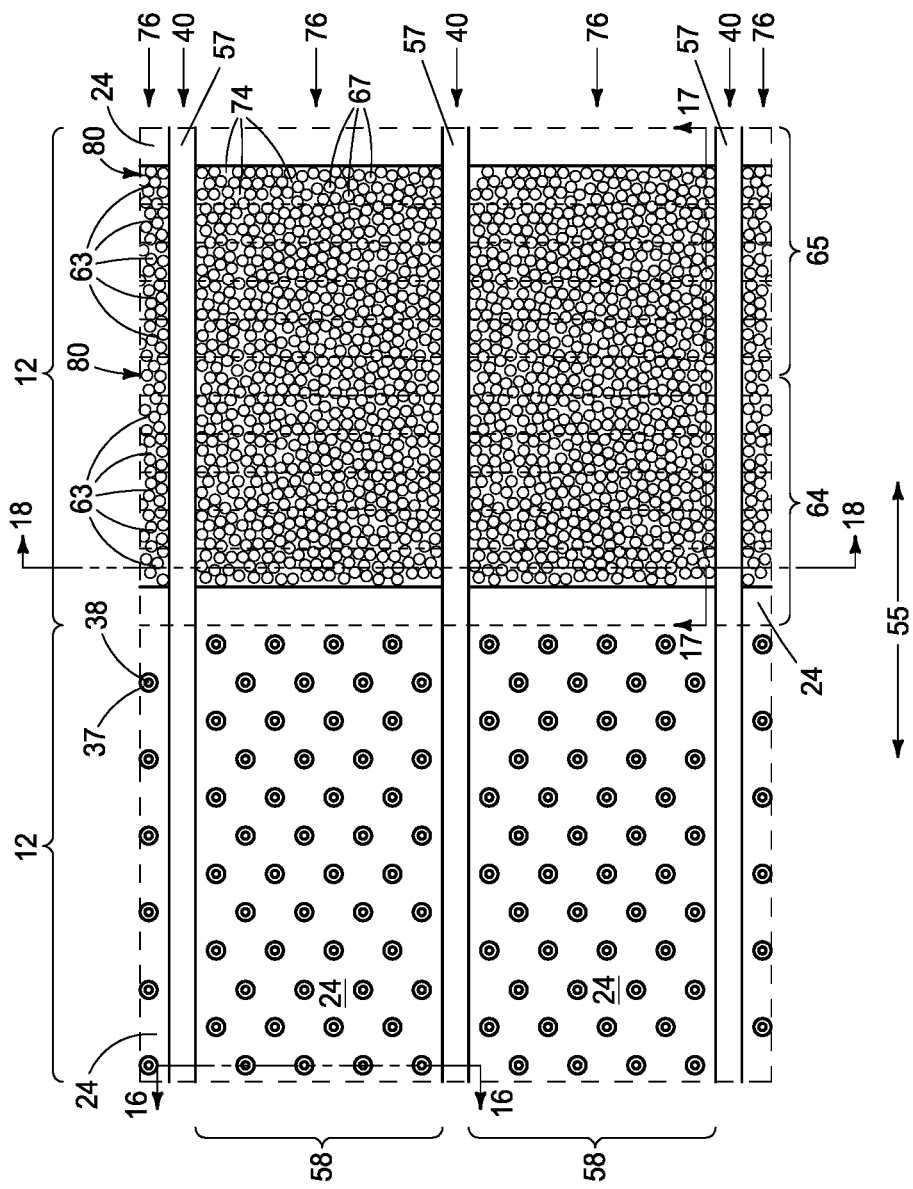

Referring to FIGS. 13 and 14, horizontally-elongated trenches 40 have been formed into stack 18 and into solid insulative material 74 and insulative physical objects 67 to form laterally-spaced memory-block regions 58 extending from memory-array region 12 into stair-step region 13. Memory-block regions 58 in stair-step region 13 comprise example laterally-spaced stair-step-structures 76 as shown. Solid insulative material 74 and insulative physical objects 67 may be planarized back at least to a top of stack 18 prior to forming trenches 40. Further and regardless, conductive vias (not shown) to steps 63 and through array vias (not shown) in stair-step region 13 may be formed before or after forming trenches 40.

Referring to FIGS. 15-21, and in one embodiment, material 26 (not shown) of conductive tiers 22 has been removed, for example by being isotropically etched away through trenches 40 ideally selectively relative to the other exposed materials (e.g., using liquid or vapor $H_3PO_4$ as a primary etchant where material 26 is silicon nitride and other materials comprise one or more oxides or polysilicon). Material 26 (not shown) in conductive tiers 22 in the example embodiment is sacrificial and has been replaced with conducting material 48, and which has thereafter been removed from trenches 40, thus forming individual conductive lines 29 (e.g., wordlines) and elevationally-extending strings 49 of individual transistors and/or memory cells 56.

Figure 16:
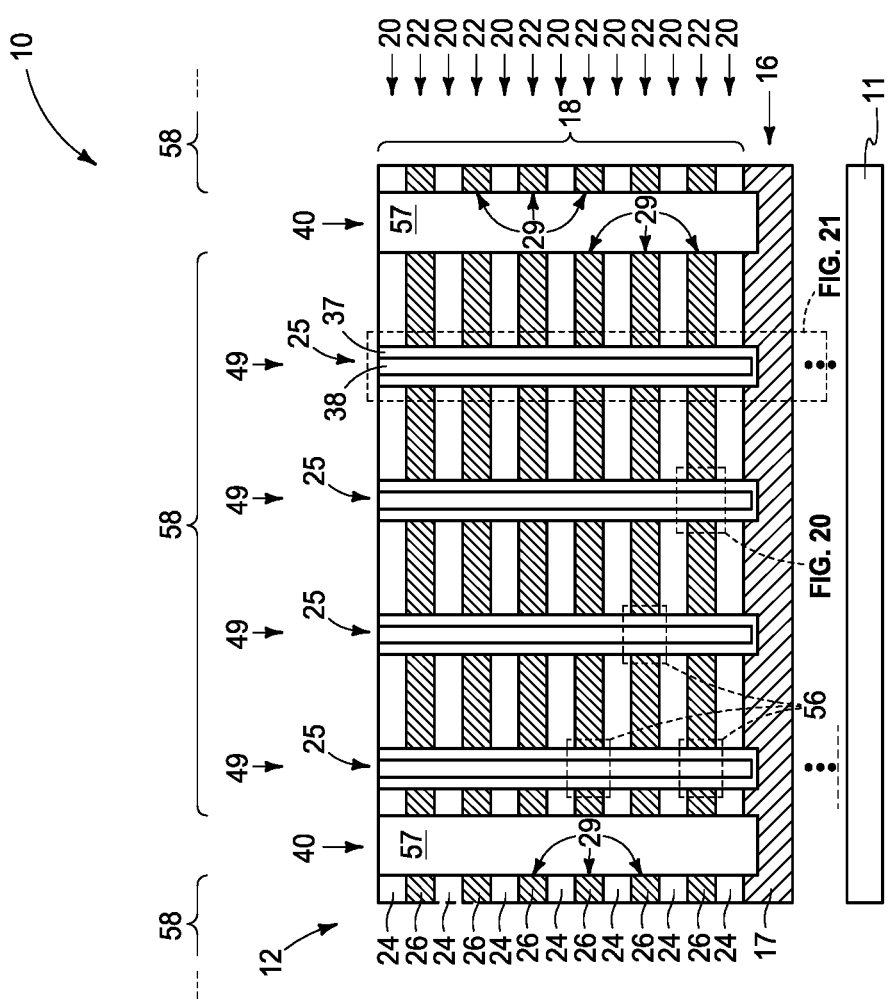
Figure 17:
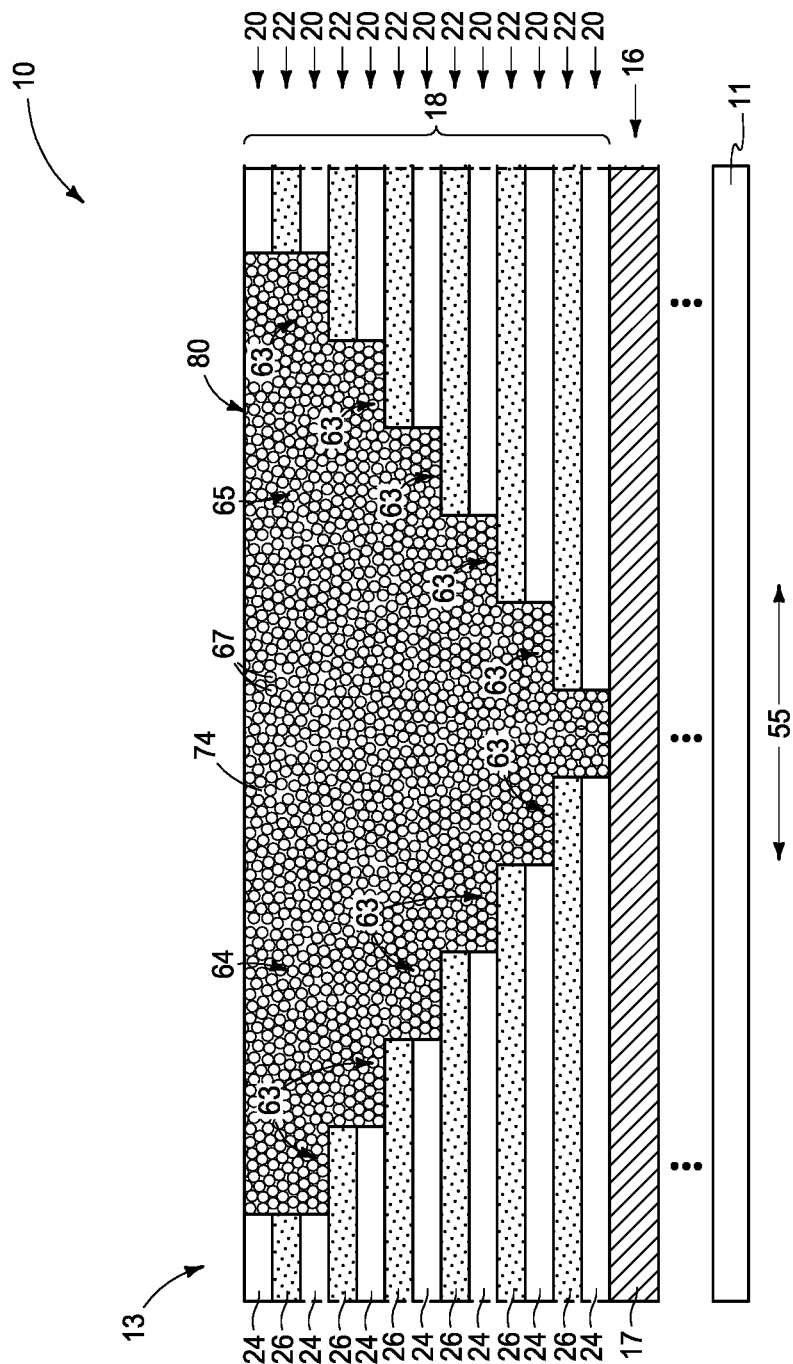
Figure 18:
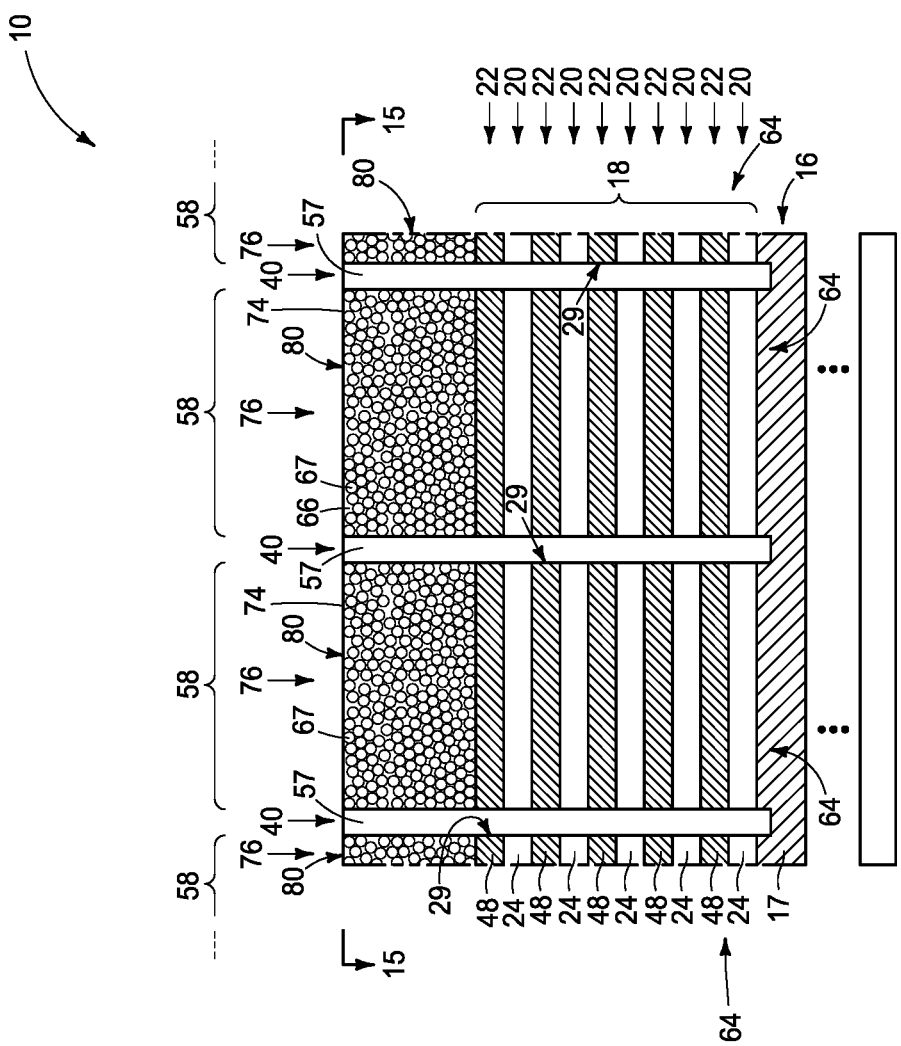

A thin insulative liner (e.g., $Al_2O_3$ and not shown) may be formed before forming conducting material 48, Approximate locations of transistors and/or memory cells 56 are indicated with a bracket in FIG. 20 and some with dashed outlines in FIGS. 16, 19, and 21, with transistors and/or memory cells 56 being essentially ring-like or annular in the depicted example. Alternately, transistors and/or memory cells 56 may not be completely encircling relative to individual channel openings 25 such that each channel opening 25 may have two or more elevationally-extending strings 49 (e.g., multiple transistors and/or memory cells about individual channel openings in individual conductive tiers with perhaps multiple wordlines per channel opening in individual conductive tiers, and not shown). Conducting material 48 may be considered as having terminal ends 50 (FIG. 20) corresponding to control-gate regions of individual transistors and/or memory cells 56. Control-gate regions 52 in the depicted embodiment comprise individual portions of individual conductive lines 29. Materials 30, 32, and 34 may be considered as a memory structure 65 that is laterally between control-gate region 52 and channel material 36. In one embodiment and as shown with respect to the example "gate-last" processing, conducting material 48 of conductive tiers 22 is formed after forming channel openings 25 and/or trenches 40. Alternately, the conducting material of the conductive tiers may be formed before forming channel openings 25 and/or trenches 40 (not shown), for example with respect to "gate-first" processing.

A charge-blocking region (e.g., charge-blocking material 30) is between storage material 32 and individual control-gate regions 52. A charge block may have the following functions in a memory cell. In a program mode, the charge block may prevent charge carriers from passing out of the storage material (e.g., floating-gate material, charge-trapping material, etc.) toward the control gate, and in an erase mode the charge block may prevent charge carriers from flowing into the storage material from the control gate. Accordingly, a charge block may function to block charge migration between the control-gate region and the storage material of individual memory cells, An example charge-blocking region as shown comprises insulator material 30. By way of further examples, a charge-blocking region may comprise a laterally (e.g., radially) outer portion of the storage material (e.g., material 32) where such storage material is insulative (e.g., in the absence of any different-composition material between an insulative storage material 32 and conducting material 48). Regardless, as an additional example, an interface of a storage material and conductive material of a control gate may be sufficient to function as a charge-blocking region in the absence of any separate-composition-insulator material 30. Further, an interface of conducting material 48 with material 30 (when present) in combination with insulator material 30 may together function as a charge-blocking region, and as alternately or additionally may a laterally-outer region of an insulative storage material (e.g., a silicon nitride material 32). An example material 30 is one or more of silicon hafnium oxide and silicon dioxide.

Intervening material 57 has been formed laterally-between and longitudinally-along immediately-laterally-adjacent memory blocks 58. Intervening material 57 may provide lateral electrical isolation (insulation) between immediately-laterally-adjacent memory-blocks. Such may include one or more of insulative, semiconductive, and conducting materials and, regardless, may facilitate conductive tiers 22 from shorting relative one another in a finished circuitry construction. Example insulative materials are one or more of $SiO_2$, $Si_3N_4$, $Al_2O_3$, and undoped polysilicon. Intervening material 57 may include through array vias (not shown).

Any other attribute(s) or aspect(s) as shown and/or described herein with respect to other embodiments may be used in the embodiments shown and described with reference to the above embodiments.

Embodiments of the invention encompass methods used in forming any existing or future-developed integrated circuitry, not just memory circuitry. Such a method comprises forming a stack (e.g., 18) comprising vertically-alternating first tiers (e.g., 22) and second tiers (e.g., 20). A stair-step structure (e.g., 64/76) is formed into the stack. A first liquid (e.g., 66) is applied onto the stair-step structure. The first liquid comprises insulative physical objects (e.g., 67) that individually have at least one of a maximum submicron dimension or a minimum submicron dimension. The first liquid is removed to leave the insulative physical objects touching one another and to have void-spaces (e.g., 70) among the touching insulative physical objects. A second liquid (e.g., 72) that is different from the first liquid is applied into the void-spaces. The second liquid is changed into a solid insulative material (e.g., 74) in the void-spaces. Any other attribute(s) or aspect(s) as shown and/or described herein with respect to other embodiments may be used.

Alternate embodiment constructions may result from method embodiments described above, or otherwise. Regardless, embodiments of the invention encompass existing or future-developed integrated circuitry independent of method of manufacture. Nevertheless, such circuitry may have any of the attributes as described herein in method embodiments. Likewise, the above-described method embodiments may incorporate, form, and/or have any of the attributes described with respect to device embodiments.

In one embodiment, integrated circuitry (e.g., 10) comprises a three-dimensional (3D) array (e.g., 12) comprising tiers (e.g., 26) of electronic components (e.g., 56). A stair-step structure (e.g., 64/76) is laterally-adjacent the 3D array. The stair-step structure has steps (e.g., 63) individually comprising a tread (e.g., 75) and a riser (e.g., 85). Insulating material (e.g., 80) is atop individual of the treads and aside individual of the risers. The insulating material comprises touching insulative physical objects (e.g., 67) having void-spaces (e.g., 70) there-among. The insulative physical objects individually have at least one of a maximum submicron dimension or a minimum submicron dimension. The insulating material also comprises solid insulative material (e.g., 74) in the void-spaces. Any other attribute(s) or aspect(s) as shown and/or described herein with respect to other embodiments may be used.

In one embodiment, a memory array comprises strings (e.g., 49) of memory cells (e.g., 56) comprising laterally-spaced memory blocks (e.g., 58) individually comprising a vertical stack (e.g., 18) comprising alternating insulative tiers (e.g., 20) and conductive tiers (e.g., 22). Channel-material strings (e.g., 53) of memory cells extend through the insulative tiers and the conductive tiers in a memory-array region (e.g., 12). The insulative tiers and the conductive tiers of the laterally-spaced memory blocks extend from the memory-array region into a stair-step region (e.g., 13) that is adjacent the memory-array region. The insulative tiers and the conductive tiers of the memory blocks in the stair-step region comprise stair-step structures (e.g., 76) that are laterally-spaced relative one another. The stair-step structures individually have steps (e.g., 63) individually comprising a tread (e.g., 75) and a riser (e.g., 85). Insulating material (e.g., 80) is atop individual of the treads and aside individual of the risers. The insulating material comprises touching insulative physical objects (e.g., 67) having void-spaces (e.g., 70) there-among. The insulative physical objects individually have at least one of a maximum submicron dimension or a minimum submicron dimension. The insulating material also comprises solid insulative material (e.g., 74) in the void-spaces. Any other attribute(s) or aspect(s) as shown and/or described herein with respect to other embodiments may be used.

The above processing(s) or construction(s) may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks and different stacks/decks may be of the same thickness or of different thicknesses relative one another. Intervening structure may, be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45" from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector. In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated regions/material s/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Any use of "row" and "column" in this document is for convenience in distinguishing one series or orientation of features from another series or orientation of features and along which components have been or may be formed. "Row" and "column" are used synonymously with respect to any series of regions, components, and/or features independent of function. Regardless, the rows may be straight and/or curved and/or parallel and/or not parallel relative one another, as may be the columns. Further, the rows and columns may intersect relative one another at 90° or at one or more other angles (i.e., other than the straight angle).

The composition of any of the conductive/conductor/conducting materials herein may be metal material and/or conductively-doped semiconductive/semiconductor/semiconducting material. "Metal material" is any one or combination of an elemental metal, any mixture or alloy of two or more elemental metals, and any one or more conductive metal compound(s).

Herein, any use of "selective" as to etch, etching, removing, removal, depositing, forming, and/or formation is such an act of one stated material relative to another stated material(s) so acted upon at a rate of at least 2:1 by volume. Further, any use of selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

CONCLUSION

In some embodiments, a method used in forming integrated circuitry comprises forming a stack comprising vertically-alternating first tiers and second tiers. A stair-step structure is formed into the stack. A first liquid is applied onto the stair-step structure. The first liquid comprises insulative physical objects that individually have at least one of a maximum submicron dimension or a minimum submicron dimension. The first liquid is removed to leave the insulative physical objects touching one another and to have void-spaces among the touching insulative physical objects. A second liquid that is different from the first liquid is applied into the void-spaces. The second liquid is changed into a solid insulative material in the void-spaces.

In some embodiments, a method used in forming a memory array comprising strings of memory cells comprises forming a stack comprising vertically-alternating first tiers and second tiers. The stack comprises a memory-array region and a stair-step region. A stair-step structure is formed into the stack in the stair-step region. A first liquid is applied onto the stair-step structure. The first liquid comprises insulative physical objects that individually have at least one of a maximum submicron dimension or a minimum submicron dimension. The first liquid is removed to leave the insulative physical objects touching one another and to have void-spaces among the touching insulative physical objects. A second liquid that is different from the first liquid is applied into the void-spaces. The second liquid is changed into a solid insulative material in the void-spaces. Channel-material strings of memory cells are formed through the first and second tiers in the memory-array region. Horizontally-elongated trenches are formed into the stack and into the solid insulative material and insulative physical objects to form laterally-spaced memory-block regions that extend from the memory-array region into the stair-step region. The memory-block regions in the stair-step region comprise laterally-spaced stair-step-structure regions.

In some embodiments, integrated circuitry comprising a three-dimensional (3D) array comprises tiers of electronic components. A stair-step structure is laterally-adjacent the 3D array. The stair-step structure has steps that individually comprise a tread and a riser. Insulating material is atop individual of the treads and aside individual of the risers. The insulating material comprises touching insulative physical objects having void-spaces there-among. The insulative physical objects individually have at least one of a maximum submicron dimension or a minimum submicron dimension. Solid insulative material is in the void-spaces.

In some embodiments, a memory array comprising strings of memory cells comprises laterally-spaced memory blocks individually comprising a vertical stack comprising alternating insulative tiers and conductive tiers. Channel-material strings of memory cells extend through the insulative tiers and the conductive tiers in a memory-array region. The insulative tiers and the conductive tiers of the laterally-spaced memory blocks extend from the memory-array region into a stair-step region that is adjacent the memory-array region. The insulative tiers and the conductive tiers of the memory blocks in the stair-step region comprise stair-step structures that are laterally-spaced relative one another and the stair-step structures individually have steps that individually comprise a tread and a riser. Insulating material is atop individual of the treads and aside individual of the risers. The insulating material comprises touching insulative physical objects having void-spaces there-among. The insulative physical objects individually have at least one of a maximum submicron dimension or a minimum submicron dimension. Solid insulative material is in the void-spaces.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. Integrated circuitry comprising:
a three-dimensional (3D) array comprising tiers of electronic components;
a stair-step structure laterally-adjacent the 3D array, the stair-step structure having steps individually comprising a tread and a riser; and
insulating material atop individual of the treads and aside individual of the risers, the insulating material comprising:
touching insulative physical objects having void-spaces there-among, the insulative physical objects individually having at least one of a maximum submicron dimension or a minimum submicron dimension, a plurality of the insulative physical objects being both vertically and laterally offset relative to one another, the insulative physical objects comprising at least one of (a) or (b), where:
(a): nanowires having two straight-line dimensions therethrough from 1 to 100 nanometers and an aspect ratio of 100 to 1,000; and
(b): nanorods having two straight-line dimensions therethrough from 1 to 100 nanometers and an aspect ratio of 2 to 99; and
solid insulative material in the void-spaces.

2. The integrated circuitry of claim 1 wherein the insulative physical objects comprise the (a).

3. The integrated circuitry of claim 1 wherein the insulative physical objects comprise a combination of the (a) and the (b).

4. The integrated circuitry of claim 1 wherein the insulative physical objects and the solid insulative material comprise the same composition relative one another.

5. The integrated circuitry of claim 1 wherein the insulative physical objects and the solid insulative material comprise different compositions relative one another.

6. The integrated circuitry of claim 1 wherein the insulative physical objects are crystalline and the solid insulative material is amorphous.

7. The integrated circuitry of claim 6 wherein the insulative physical objects and the solid insulative material comprise the same composition relative one another.

8. The integrated circuitry of claim 6 wherein the insulative physical objects and the solid insulative material different compositions relative one another.

9. The memory array of claim 1 wherein some but not all immediately-adjacent of the physical objects touch one another.

10. The integrated circuitry of claim 1 wherein the insulative physical objects comprise the (b).

11. The integrated circuitry of claim 1 wherein the insulative physical objects comprise only one of the (a) and the (b).

12. A memory array comprising strings of memory cells, comprising:
laterally-spaced memory blocks individually comprising a vertical stack comprising alternating insulative tiers and conductive tiers, channel-material strings of memory cells extending through the insulative tiers and the conductive tiers in a memory-array region;
the insulative tiers and the conductive tiers of the laterally-spaced memory blocks extending from the memory-array region into a stair-step region that is adjacent the memory-array region, the insulative tiers and the conductive tiers of the memory blocks in the stair-step region comprising stair-step structures that are laterally-spaced relative one another the stair-step structures individually having steps individually comprising a tread and a riser;
insulating material atop individual of the treads and aside individual of the risers, the insulating material comprising:
touching insulative physical objects having void-spaces there-among, the insulative physical objects individually having at least one of a maximum submicron dimension or a minimum submicron dimension, a plurality of the insulative physical objects being both vertically and laterally offset relative to one another, the insulative physical objects comprising at least one of (a) or (b), where:
(a): nanowires having two straight-line dimensions therethrough from 1 to 100 nanometers and an aspect ratio of 100 to 1,000; and
(b): nanorods having two straight-line dimensions therethrough from 1 to 100 nanometers and an aspect ratio of 2 to 99; and
solid insulative material in the void-spaces.

13. The memory array of claim 12 wherein memory array and the strings comprising NAND.

14. The memory array of claim 12 wherein some but not all immediately-adjacent of the physical objects touch one another.

15. The memory array of claim 12 wherein the insulative physical objects comprise the (a).

16. The memory array of claim 12 wherein the insulative physical objects comprise the (b).

17. The memory array of claim 12 wherein the insulative physical objects comprise the (a) and the (b).

18. The memory array of claim 12 wherein the insulative physical objects comprise only one of the (a) and the (b).

\* \* \* \* \*